United States Patent
Wan et al.

(10) Patent No.: US 12,425,130 B2
(45) Date of Patent: Sep. 23, 2025

(54) METHOD FOR POLAR CODE DESIGN WITH PARITY CHECK BITS

(71) Applicant: Samsung Electronics Co., Ltd., Suwon-si (KR)

(72) Inventors: Heping Wan, Plano, TX (US); Joonyoung Cho, Portland, OR (US); Jianzhong Zhang, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/617,433

(22) Filed: Mar. 26, 2024

(65) Prior Publication Data

US 2025/0112728 A1    Apr. 3, 2025

Related U.S. Application Data

(60) Provisional application No. 63/542,196, filed on Oct. 3, 2023.

(51) Int. Cl.
   *H04L 1/00* (2006.01)
   *H03M 13/05* (2006.01)
   *H03M 13/11* (2006.01)
   *H03M 13/25* (2006.01)

(52) U.S. Cl.
   CPC .......... *H04L 1/0057* (2013.01); *H03M 13/05* (2013.01); *H03M 13/1174* (2013.01); *H04L 1/0041* (2013.01); *H04L 1/0063* (2013.01); *H03M 13/251* (2013.01)

(58) Field of Classification Search
   CPC ... H04L 1/0057; H04L 1/0041; H04L 1/0063; H03M 13/05; H03M 13/1174; H03M 13/251
   See application file for complete search history.

(56) References Cited

U.S. PATENT DOCUMENTS

| | | | |
|---|---|---|---|
| 11,206,045 B1* | 12/2021 | Khan | H03M 13/13 |
| 2018/0076929 A1* | 3/2018 | Zhang | H03M 13/611 |
| 2018/0278272 A1* | 9/2018 | Li | H04L 1/0061 |
| 2019/0305887 A1 | 10/2019 | Jang et al. | |
| 2020/0036477 A1* | 1/2020 | Xu | G06F 9/30029 |
| 2022/0231703 A1 | 7/2022 | Hui et al. | |
| 2023/0046507 A1 | 2/2023 | Zhang et al. | |

(Continued)

OTHER PUBLICATIONS

V. Bioglio, C. Condo and I. Land, "Design of Polar Codes in 5G New Radio," in IEEE Communications Surveys & Tutorials, vol. 23, No. 1, pp. 29-40, Firstquarter 2021, (Year: 2021).*

(Continued)

*Primary Examiner* — Cynthia Britt

(57) ABSTRACT

Error-correcting performance of polar codes is improved by assigning parity check bits to small, reliable indices. Zeros are assigned to message indices not among a most-reliable set of the message indices, information bits and parity check bits are assigned to the most-reliable set of the message indices, with the parity check bits generated on the information bits assigned to the smallest of the most-reliable set and then assigned to the smallest indices of the most-reliable set that follow the information bits on which the parity check pits are generated. During successive cancellation list decoding, the parity check bits allow error events to be promptly corrected during decoding.

20 Claims, 13 Drawing Sheets

(56) References Cited

U.S. PATENT DOCUMENTS

2023/0163784 A1    5/2023    Wang et al.
2023/0224077 A1    7/2023    Xu et al.

OTHER PUBLICATIONS

H. Zhang et al., "Parity-Check Polar Coding for 5G and Beyond," 2018 IEEE International Conference on Communications (ICC), Kansas City, MO, USA, 2018, pp. 1-7, (Year: 2018).*

H. Ju, S. Jang and S.-H. Kim, "On the Design of Parity-Check Polar Codes," 2024 15th International Conference on Information and Communication Technology Convergence (ICTC), Jeju Island, Korea, Republic of, 2024, pp. 755-758 (Year: 2024).*

International Search Report and Written Opinion issued Jan. 6, 2025 regarding International Application No. PCT/KR2024/015019, 9 pages.

"3rd Generation Partnership Project; Technical Specification Group Radio Access Network; NR; Multiplexing and channel coding (Release 16)", 3GPP TS 38.212 V16.0.0, Dec. 2019, 145 pages.

Arikan, E., "Channel polarization: A method for constructing capacity-achieving codes for symmetric binary-input memoryless channels", IEEE Transactions on Information Theory, vol. 55, No. 7, pp. 3051-3073, Jul. 20, 2009, 23 pages.

Arikan, E., "From Sequential Decoding to Channel Polarization and Back Again," arXiv:1908.09594v3 [cs.IT], Sep. 9, 2019, 10 pages.

\* cited by examiner

METHOD FOR POLAR CODE DESIGN WITH PARITY CHECK BITS

CROSS-REFERENCE TO RELATED APPLICATION AND PRIORITY CLAIM

This application claims priority under 35 U.S.C. § 119(e) to U.S. Provisional Patent Application No. 63/542,196 filed on Oct. 3, 2023, which is hereby incorporated by reference in its entirety.

TECHNICAL FIELD

This disclosure relates generally to polar coding for wireless communication. More specifically, this disclosure relates to improving error correcting ability of polar codes.

BACKGROUND

The use of computing technology for media processing is greatly expanding, largely due to the usability, convenience, computing power of computing devices, and the like. Portable electronic devices, such as laptops and mobile smart phones are becoming increasingly popular as a result of the devices becoming more compact, while the processing power and resources included in a given device is increasing. Even with the increase of processing power, portable electronic devices often struggle to provide the processing capabilities to handle new services and applications, as newer services and applications often require more resources that is included in a portable electronic device. Thus, improved methods and apparatus for configuring and deploying media processing in the network are needed.

SUMMARY

This disclosure provides a method and apparatus for improving error-correcting performance of polar codes by including parity check bits at indices where zeros would otherwise be placed. Error-correcting performance of polar codes is improved by assigning parity check bits to small, reliable indices. Zeros are assigned to message indices not among a most-reliable set of the message indices, information bits and parity check bits are assigned to the most-reliable set of the message indices, with the parity check bits generated on the information bits assigned to the smallest of the most-reliable set and then assigned to the smallest indices of the most-reliable set that follow the information bits on which the parity check pits are generated. During successive cancellation list decoding, the parity check bits allow error events to be promptly corrected during decoding.

In a first embodiment, a method for encoding includes receiving a plurality of information bits to be transmitted in a plurality of message indices. The method further includes assigning zeros to message indices not among a most-reliable set of the message indices. The method still further includes assigning the plurality of information bits to message indices among the most-reliable set of the message indices. The method also includes identifying a set of the information bits to be used in generating parity check bits to improve error-correcting performance. The method includes generating the parity check bits based on the identified set of the information bits, assigning the parity check bits to selected message indices among the most-reliable set of the message indices, and generating a plurality of polar encoded bits by performing a polar encoding operation on bits assigned to the message indices. The method includes providing the plurality of polar encoded bits for transmission or storage.

In a second embodiment, an encoding apparatus includes a transceiver and a processor. The processor is configured to receive a plurality of information bits to be transmitted in a plurality of message indices. The processor is further configured to assign zeros to message indices not among a reliable set of the message indices. The processor is still further configured to assign the plurality of information bits to message indices among the reliable set of the message indices. The processor is also configured to identify a set of the information bits to be used in generating parity check bits to improve error-correcting performance. The processor is configured to generate the parity check bits based on the identified set of the information bits, assign the parity check bits to selected message indices among the reliable set of the message indices, and generate a plurality of polar encoded bits by performing a polar encoding operation on bits assigned to the message indices. The processor is configured to provide the plurality of polar encoded bits for transmission or storage.

In a third embodiment, a decoding apparatus for use in a communication channel includes a transceiver configured to receive a polar code with parity check bits from the communication channel, and a processor configured to perform successive cancellation list decoding of the polar code with parity check bits. The polar code with parity check bits is generated by receiving a plurality of information bits to be transmitted in a plurality of message indices. The polar code with parity check bits is further generated by assigning zeros to message indices not among a reliable set of the message indices. The polar code with parity check bits is still further generated by assigning the plurality of information bits to message indices among the reliable set of the message indices. The polar code with parity check bits is also generated by identifying a set of the information bits to be used in generating parity check bits to improve error-correcting performance. The polar code with parity check bits is generated by generating the parity check bits based on the identified set of the information bits, assigning the parity check bits to selected message indices among the reliable set of the message indices, and generating a plurality of polar encoded bits by performing a polar encoding operation on bits assigned to the message indices. The plurality of polar encoded bits are provided for transmission or storage.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12C, described below, and the various embodiments used to describe the principles of the present disclosure are by way of illustration only and should not be construed in any way to limit the scope of the disclosure. Those skilled in the art will understand that the principles of the present disclosure may be implemented in any type of suitably arranged device or system.

The following references are incorporated herein by reference:

[1] E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073 July 2009.

[2] E. Arikan, "From sequential decoding to channel polarization and back again," available at https://arxiv.org/abs/1908.09594, August 2019.

In the short-block length regime, the virtual sub-channels associated with polar codes are not fully polarized, which means such virtual sub-channels are neither purely noisy nor noiseless. Therefore, placing zeros at indices belonging to the frozen set may lead to rate loss. The gap relative to theoretical performance is partially due to the rate loss when assigning zeros at indices whose corresponding virtual sub-channels are not polarized to pure noisy ones (zero capacity).

Based on the intuition of spreading message bits over multiple virtual sub-channels, in the present disclosure, the parity check bits with respect to message bits are generated and sent through the virtual sub-channels, such that the error-correcting performance of polar codes is improved. The polar encoding chain is unchanged, except that during rate profiling, some parity check bits are generated and assigned at indices where zeros used to be placed. Various approaches for generating the parity check bits and selecting the virtual sub-channels to transmit the parity check bits are described.

FIGS. 1-3 and 4A-4B describe various embodiments implemented in wireless communications systems and with the use of orthogonal frequency division multiplexing (OFDM) or orthogonal frequency division multiple access (OFDMA) communication techniques. The descriptions of FIGS. 1-3 and 4A-4B are not meant to imply physical or architectural limitations to how different embodiments may be implemented. Different embodiments of the present disclosure may be implemented in any suitably arranged communications system.

Figure 1:
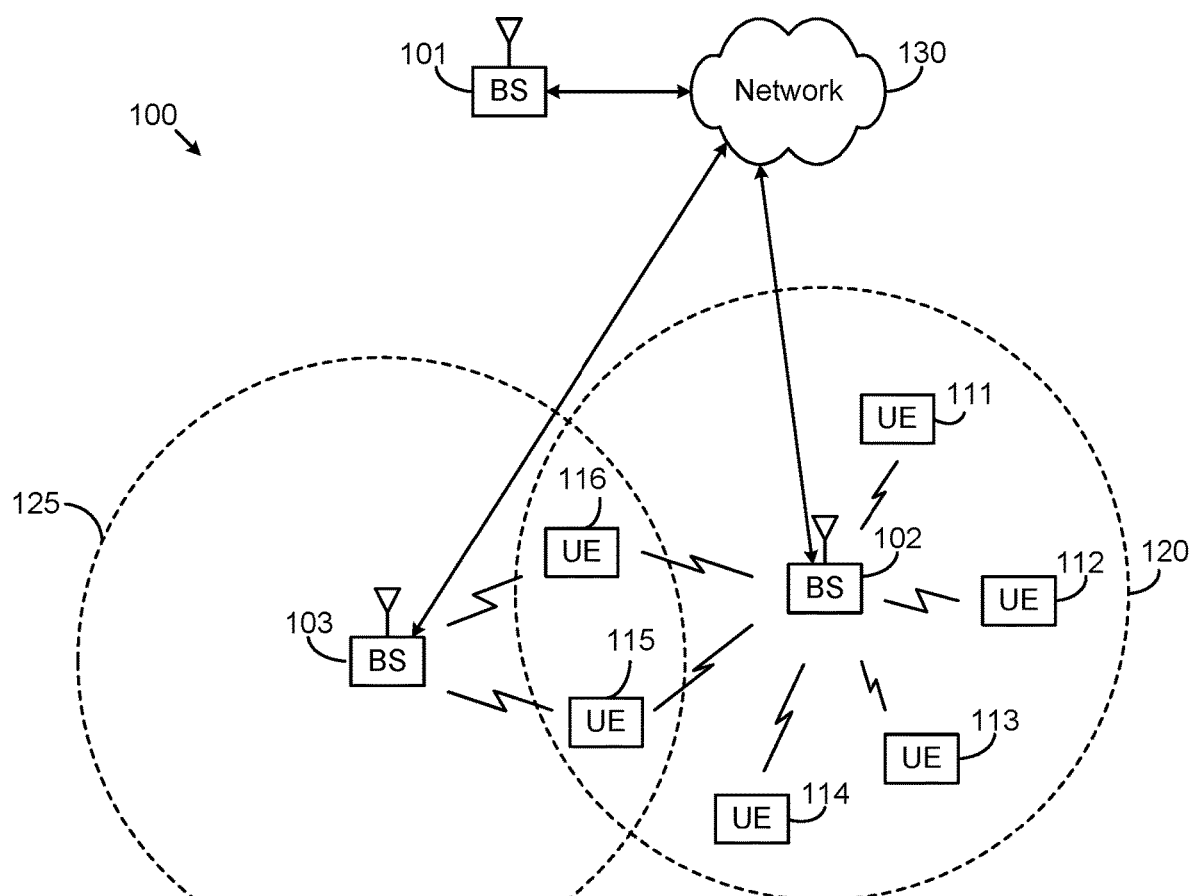
FIG. 1 illustrates an example wireless network 100 within which polar codes with parity check bits may be implemented according to embodiments of the present disclosure.

FIG. 1 illustrates an example wireless network 100 within which polar codes with parity check bits may be implemented according to embodiments of the present disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes a gNB 101 (e.g., base station, BS), a gNB 102, and a gNB 103. The gNB 101 communicates with the gNB 102 and the gNB 103. The gNB 101 also communicates with at least one network 130, such as the Internet, a proprietary Internet Protocol (IP) network, or other data network.

The gNB 102 provides wireless broadband access to the network 130 for a first plurality of user equipments (UEs) within a coverage area 120 of the gNB 102. The first plurality of UEs includes a UE 111, which may be located in a small business; a UE 112, which may be located in an enterprise; a UE 113, which may be a WiFi hotspot; a UE 114, which may be located in a first residence; a UE 115, which may be located in a second residence; and a UE 116, which may be a mobile device, such as a cell phone, a wireless laptop, a wireless PDA, or the like. The gNB 103 provides wireless broadband access to the network 130 for a second plurality of UEs within a coverage area 125 of the gNB 103. The second plurality of UEs includes the UE 115 and the UE 116. In some embodiments, one or more of the gNBs 101-103 may communicate with each other and with the UEs 111-116 using $3^{rd}$ Generation Partnership Project 5G/New Radio (NR), long term evolution (LTE), long term evolution-advanced (LTE-A), WiMAX, WiFi, or other wireless communication techniques.

Depending on the network type, the term "base station" or "BS" can refer to any component (or collection of components) configured to provide wireless access to a network, such as transmit point (TP), transmit-receive point (TRP), an enhanced base station (eNodeB or eNB), a 5G/NR base station (gNB), a macrocell, a femtocell, a WiFi access point (AP), or other wirelessly enabled devices. Base stations may provide wireless access in accordance with one or more wireless communication protocols, e.g., 3GPP 5G/NR, Long Term Evolution (LTE), LTE advanced (LTE-A), high speed packet access (HSPA), Wi-Fi 802.11a/b/g/n/ac, etc. For the sake of convenience, the terms "BS" and "TRP" are used interchangeably in this patent document to refer to network infrastructure components that provide wireless access to remote terminals. Also, depending on the network type, the term "user equipment" or "UE" can refer to any component such as "mobile station," "subscriber station," "remote terminal," "wireless terminal," "receive point," or "user device." For the sake of convenience, the terms "user equipment" and "UE" are used in this patent document to refer to remote wireless equipment that wirelessly accesses a BS, whether the UE is a mobile device (such as a mobile telephone or smartphone) or is normally considered a stationary device (such as a desktop computer or vending machine).

The dotted lines show the approximate extents of the coverage areas 120 and 125, which are shown as approximately circular for the purposes of illustration and explanation only. It should be clearly understood that the coverage areas associated with gNBs, such as the coverage areas 120 and 125, may have other shapes, including irregular shapes, depending upon the configuration of the gNBs and variations in the radio environment associated with natural and man-made obstructions.

As described in more detail below, one or more of the UEs 111-116 include circuitry, programming, or a combination thereof for energy buffer information for improving polar codes with parity check bits. In certain embodiments, one or more of the BSs 101-103 include circuitry, programming, or a combination thereof for improving polar codes with parity check bits.

Although FIG. 1 illustrates one example of a wireless network, various changes may be made to FIG. 1. For example, the wireless network 100 could include any number of gNBs and any number of UEs in any suitable arrangement. Also, the gNB 101 could communicate directly with any number of UEs and provide those UEs with wireless broadband access to the network 130. Similarly, each gNB 102-103 could communicate directly with the network 130 and provide UEs with direct wireless broadband access to the network 130. Further, the gNBs 101, 102, and/or 103 could provide access to other or additional external networks, such as external telephone networks or other types of data networks.

Figure 2:
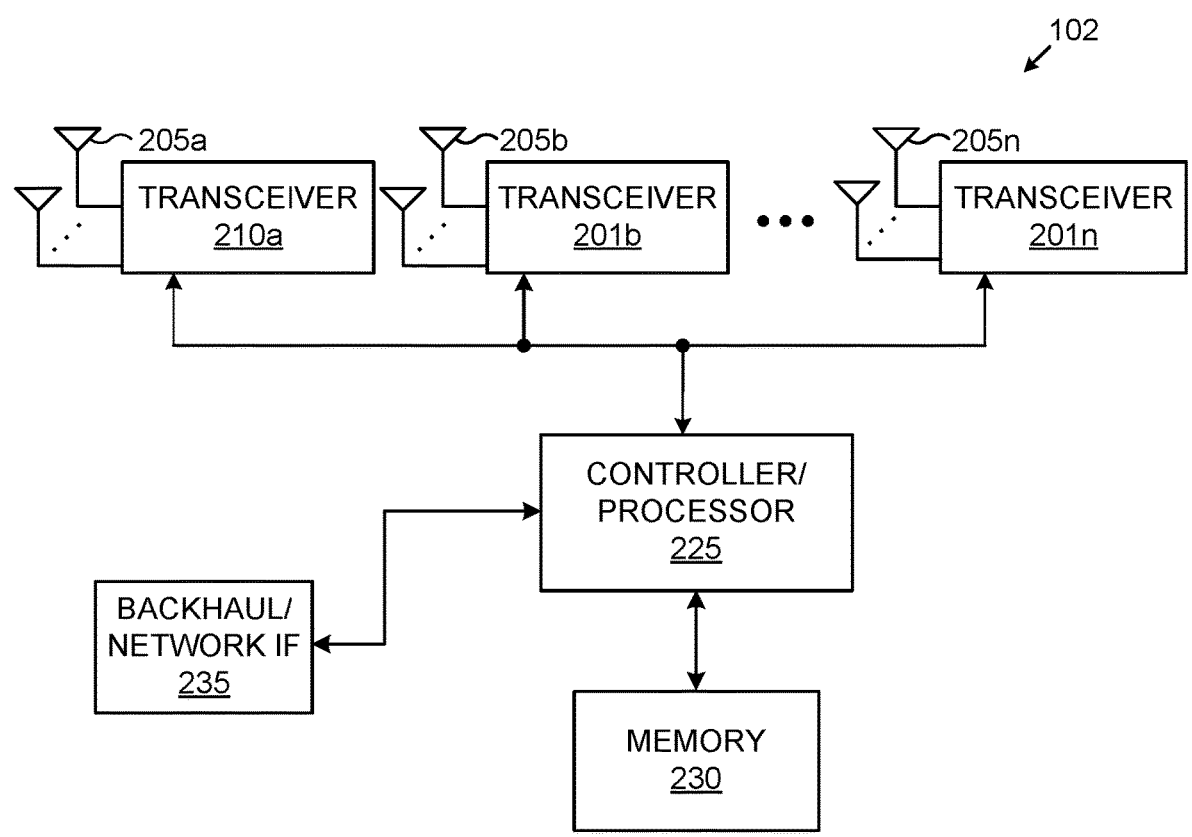
FIG. 2 illustrates an example gNB 102 within which polar codes with parity check bits may be implemented according to embodiments of the present disclosure.

FIG. 2 illustrates an example gNB 102 within which polar codes with parity check bits may be implemented according to embodiments of the present disclosure. The embodiment of the gNB 102 illustrated in FIG. 2 is for illustration only, and the gNBs 101 and 103 of FIG. 1 could have the same or similar configuration. However, gNBs come in a wide variety of configurations, and FIG. 2 does not limit the scope of this disclosure to any particular implementation of a gNB.

As shown in FIG. 2, the gNB 102 includes multiple antennas 205a-205n, multiple transceivers 210a-210n, a controller/processor 225, a memory 230, and a backhaul or network interface 235.

The transceivers 210a-210n receive, from the antennas 205a-205n, incoming radio frequency (RF) signals, such as signals transmitted by UEs in the wireless network 100. The transceivers 210a-210n down-convert the incoming RF signals to generate IF or baseband signals. The IF or baseband signals are processed by receive (RX) processing circuitry in the transceivers 210a-210n and/or controller/processor 225, which generates processed baseband signals by filtering, decoding, and/or digitizing the baseband or IF signals. The controller/processor 225 may further process the baseband signals.

Transmit (TX) processing circuitry in the transceivers 210a-210n and/or controller/processor 225 receives analog or digital data (such as voice data, web data, e-mail, or interactive video game data) from the controller/processor 225. The TX processing circuitry encodes, multiplexes, and/or digitizes the outgoing baseband data to generate processed baseband or IF signals. The transceivers 210a-210n up-converts the baseband or IF signals to RF signals that are transmitted via the antennas 205a-205n.

The controller/processor 225 can include one or more processors or other processing devices that control the overall operation of the gNB 102. For example, the controller/processor 225 could control the reception of uplink (UL) channel signals and the transmission of downlink (DL) channel signals by the transceivers 210a-210n in accordance with well-known principles. The controller/processor 225 could support additional functions as well, such as more advanced wireless communication functions. For instance, the controller/processor 225 could support beam forming or directional routing operations in which outgoing/incoming signals from/to multiple antennas 205a-205n are weighted differently to effectively steer the outgoing signals in a desired direction. As another example, the controller/processor 225 could support methods for improving polar codes with parity check bits. Any of a wide variety of other functions could be supported in the gNB 102 by the controller/processor 225.

The controller/processor 225 is also capable of executing programs and other processes resident in the memory 230, such as processes for improving polar codes with parity check bits. The controller/processor 225 can move data into or out of the memory 230 as required by an executing process.

The controller/processor 225 is also coupled to the backhaul or network interface 235. The backhaul or network interface 235 allows the gNB 102 to communicate with other devices or systems over a backhaul connection or over a network. The interface 235 could support communications over any suitable wired or wireless connection(s). For example, when the gNB 102 is implemented as part of a cellular communication system (such as one supporting 5G/NR, LTE, or LTE-A), the interface 235 could allow the gNB 102 to communicate with other gNBs over a wired or wireless backhaul connection. When the gNB 102 is implemented as an access point, the interface 235 could allow the gNB 102 to communicate over a wired or wireless local area network or over a wired or wireless connection to a larger network (such as the Internet). The interface 235 includes any suitable structure supporting communications over a wired or wireless connection, such as an Ethernet or transceiver.

The memory 230 is coupled to the controller/processor 225. Part of the memory 230 could include a RAM, and another part of the memory 230 could include a Flash memory or other ROM.

Although FIG. 2 illustrates one example of gNB 102, various changes may be made to FIG. 2. For example, the gNB 102 could include any number of each component shown in FIG. 2. Also, various components in FIG. 2 could be combined, further subdivided, or omitted and additional components could be added according to particular needs.

Figure 3:
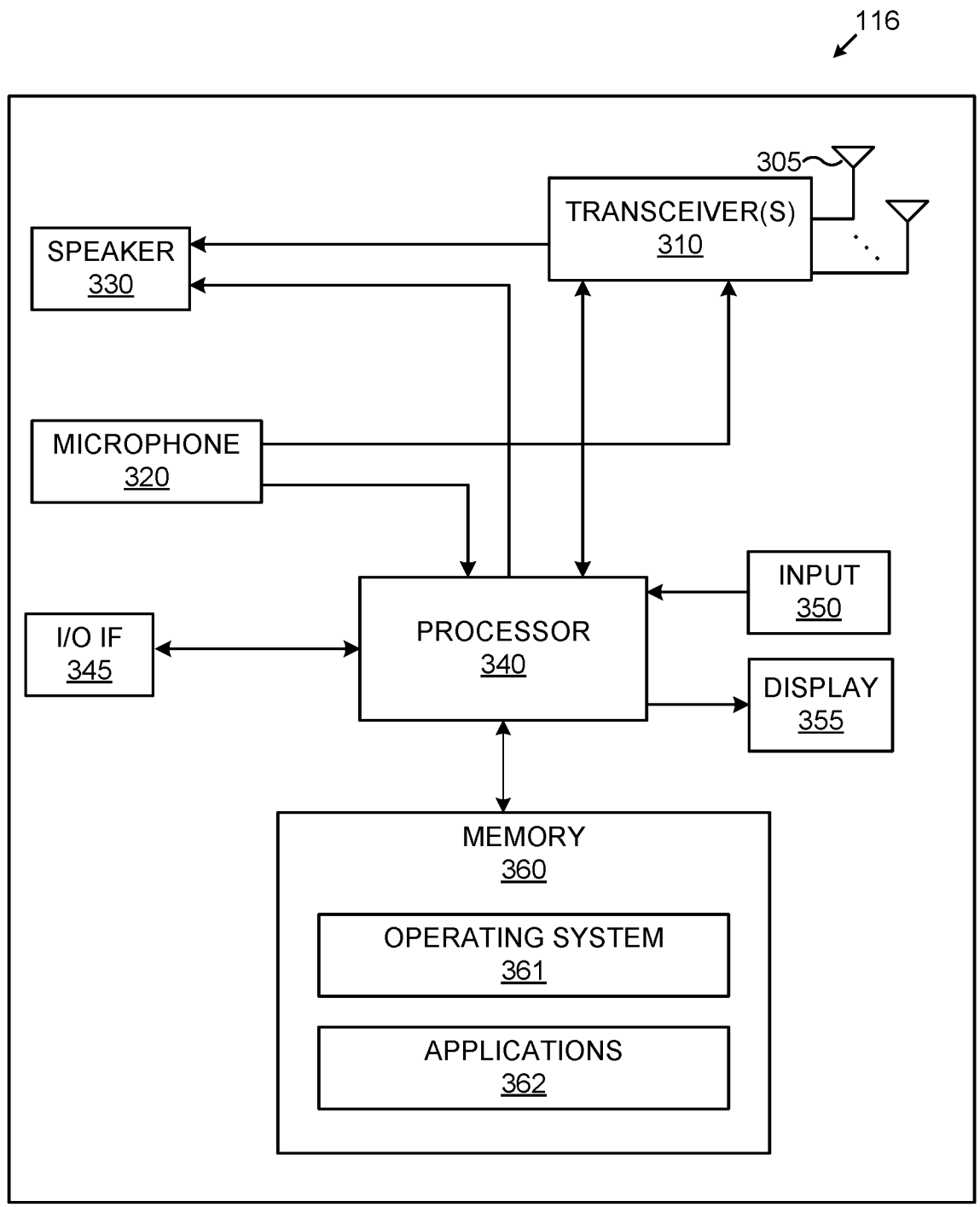
FIG. 3 illustrates an example UE 116 within which polar codes with parity check bits may be implemented according to embodiments of the present disclosure.

FIG. 3 illustrates an example UE 116 within which polar codes with parity check bits may be implemented according to embodiments of the present disclosure. The embodiment of the UE 116 illustrated in FIG. 3 is for illustration only, and the UEs 111-115 of FIG. 1 could have the same or similar configuration. However, UEs come in a wide variety of configurations, and FIG. 3 does not limit the scope of this disclosure to any particular implementation of a UE.

As shown in FIG. 3, the UE 116 includes antenna(s) 305, a transceiver(s) 310, and a microphone 320. The UE 116 also includes a speaker 330, a processor 340, an input/output (I/O) interface (IF) 345, an input 350, a display 355, and a memory 360. The memory 360 includes an operating system (OS) 361 and one or more applications 362.

The transceiver(s) 310 receives from the antenna(s) 305, an incoming RF signal transmitted by a gNB of the wireless network 100. The transceiver(s) 310 down-converts the incoming RF signal to generate an intermediate frequency (IF) or baseband signal. The IF or baseband signal is processed by RX processing circuitry in the transceiver(s) 310 and/or processor 340, which generates a processed baseband signal by filtering, decoding, and/or digitizing the baseband or IF signal. The RX processing circuitry sends the processed baseband signal to the speaker 330 (such as for voice data) or is processed by the processor 340 (such as for web browsing data).

TX processing circuitry in the transceiver(s) 310 and/or processor 340 receives analog or digital voice data from the microphone 320 or other outgoing baseband data (such as web data, e-mail, or interactive video game data) from the processor 340. The TX processing circuitry encodes, multiplexes, and/or digitizes the outgoing baseband data to generate a processed baseband or IF signal. The transceiver(s) 310 up-converts the baseband or IF signal to an RF signal that is transmitted via the antenna(s) 305.

The processor 340 can include one or more processors or other processing devices and execute the OS 361 stored in the memory 360 in order to control the overall operation of the UE 116. For example, the processor 340 could control the reception of DL channel signals and the transmission of UL channel signals by the transceiver(s) 310 in accordance with well-known principles. In some embodiments, the processor 340 includes at least one microprocessor or microcontroller.

The processor 340 is also capable of executing other processes and programs resident in the memory 360. For example, the processor 340 may execute processes for improving polar codes with parity check bits as described in embodiments of the present disclosure. The processor 340 can move data into or out of the memory 360 as required by an executing process. In some embodiments, the processor 340 is configured to execute the applications 362 based on the OS 361 or in response to signals received from gNBs or an operator. The processor 340 is also coupled to the I/O interface 345, which provides the UE 116 with the ability to connect to other devices, such as laptop computers and handheld computers. The I/O interface 345 is the communication path between these accessories and the processor 340.

The processor 340 is also coupled to the input 350, which includes, for example, a touchscreen, keypad, etc., and the display 355. The operator of the UE 116 can use the input 350 to enter data into the UE 116. The display 355 may be a liquid crystal display, light emitting diode display, or other display capable of rendering text and/or at least limited graphics, such as from web sites.

The memory 360 is coupled to the processor 340. Part of the memory 360 could include a random-access memory (RAM), and another part of the memory 360 could include a Flash memory or other read-only memory (ROM).

Although FIG. 3 illustrates one example of UE 116, various changes may be made to FIG. 3. For example, various components in FIG. 3 could be combined, further subdivided, or omitted and additional components could be added according to particular needs. As a particular example, the processor 340 could be divided into multiple processors, such as one or more central processing units (CPUs) and one or more graphics processing units (GPUs). In another example, the transceiver(s) 310 may include any number of transceivers and signal processing chains and may be connected to any number of antennas. Also, while FIG. 3 illustrates the UE 116 configured as a mobile telephone or smartphone, UEs could be configured to operate as other types of mobile or stationary devices.

Figure 4A:
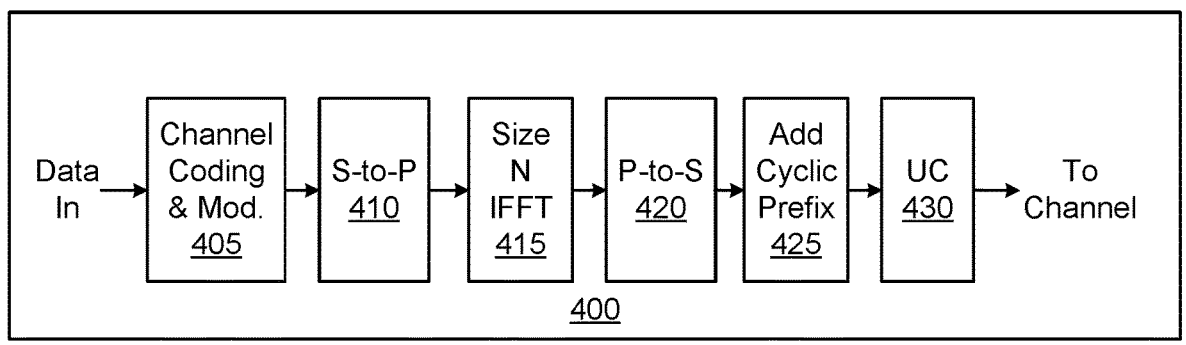
FIG. 4A and FIG. 4B illustrate an example of wireless transmit and receive paths, respectively, which may be sued to transmit or receive polar codes with parity check bits according to embodiments of the present disclosure.
Figure 4B:
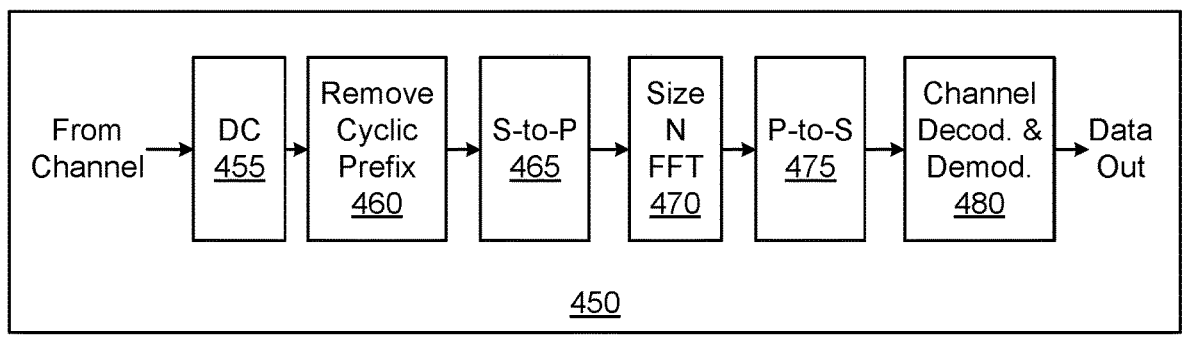

FIG. 4A and FIG. 4B illustrate an example of wireless transmit and receive paths 400 and 450, respectively, which may be sued to transmit or receive polar codes with parity check bits according to embodiments of the present disclosure. For example, a transmit path 400 may be described as being implemented in a gNB (such as gNB 102), while a receive path 450 may be described as being implemented in a UE (such as UE 116). However, it will be understood that the receive path 450 can be implemented in a gNB and that the transmit path 400 can be implemented in a UE. In some embodiments, the transmit path 400 is configured to transmit data signals with polar codes improved by parity check bits as described in embodiments of the present disclosure.

As illustrated in FIG. 4A, the transmit path 400 includes a channel coding and modulation block 405, a serial-to-parallel (S-to-P) block 410, a size N Inverse Fast Fourier Transform (IFFT) block 415, a parallel-to-serial (P-to-S) block 420, an add cyclic prefix block 425, and an up-converter (UC) 430. The receive path 250 includes a down-converter (DC) 455, a remove cyclic prefix block 460, a S-to-P block 465, a size N Fast Fourier Transform (FFT) block 470, a parallel-to-serial (P-to-S) block 475, and a channel decoding and demodulation block 480.

In the transmit path 400, the channel coding and modulation block 405 receives a set of information bits, applies coding (such as a low-density parity check (LDPC) coding), and modulates the input bits (such as with Quadrature Phase Shift Keying (QPSK) or Quadrature Amplitude Modulation (QAM)) to generate a sequence of frequency-domain modulation symbols. The serial-to-parallel block 410 converts (such as de-multiplexes) the serial modulated symbols to parallel data in order to generate N parallel symbol streams, where N is the IFFT/FFT size used in the gNB 102 and the UE 116. The size N IFFT block 415 performs an IFFT operation on the N parallel symbol streams to generate time-domain output signals. The parallel-to-serial block 420 converts (such as multiplexes) the parallel time-domain output symbols from the size N IFFT block 415 in order to generate a serial time-domain signal. The add cyclic prefix block 425 inserts a cyclic prefix to the time-domain signal. The up-converter 430 modulates (such as up-converts) the output of the add cyclic prefix block 425 to a RF frequency for transmission via a wireless channel. The signal may also be filtered at a baseband before conversion to the RF frequency.

As illustrated in FIG. 4B, the down-converter 455 down-converts the received signal to a baseband frequency, and the remove cyclic prefix block 460 removes the cyclic prefix to generate a serial time-domain baseband signal. The serial-to-parallel block 465 converts the time-domain baseband signal to parallel time-domain signals. The size N FFT block 470 performs an FFT algorithm to generate N parallel frequency-domain signals. The (P-to-S) block 475 converts the parallel frequency-domain signals to a sequence of modulated data symbols. The channel decoding and demodulation block 480 demodulates and decodes the modulated symbols to recover the original input data stream.

Each of the gNBs 101-103 may implement a transmit path 400 that is analogous to transmitting in the downlink to UEs 111-116 and may implement a receive path 450 that is analogous to receiving in the uplink from UEs 111-116. Similarly, each of UEs 111-116 may implement a transmit path 400 for transmitting in the uplink to gNBs 101-103 and may implement a receive path 450 for receiving in the downlink from gNBs 101-103.

Each of the components in FIGS. 4A and 4B can be implemented using only hardware or using a combination of hardware and software/firmware. As a particular example, at least some of the components in FIGS. 4A and 4B may be implemented in software, while other components may be implemented by configurable hardware or a mixture of software and configurable hardware. For instance, the FFT block 470 and the IFFT block 415 may be implemented as configurable software algorithms, where the value of size N may be modified according to the implementation.

Furthermore, although described as using FFT and IFFT, this is by way of illustration only and should not be construed to limit the scope of this disclosure. Other types of transforms, such as Discrete Fourier Transform (DFT) and Inverse Discrete Fourier Transform (IDFT) functions, can be used. It will be appreciated that the value of the variable N may be any integer number (such as 1, 2, 3, 4, or the like) for DFT and IDFT functions, while the value of the variable N may be any integer number that is a power of two (such as 1, 2, 4, 8, 16, or the like) for FFT and IFFT functions.

Although FIGS. 4A and 4B illustrate examples of wireless transmit and receive paths 400 and 450, respectively, various changes may be made to FIGS. 4A and 4B. For example, various components in FIGS. 4A and 4B can be combined, further subdivided, or omitted and additional components can be added according to particular needs. Also, FIGS. 4A and 4B are meant to illustrate examples of the types of transmit and receive paths that can be used in a wireless network. Any other suitable architectures can be used to support wireless communications in a wireless network.

Figure 5:
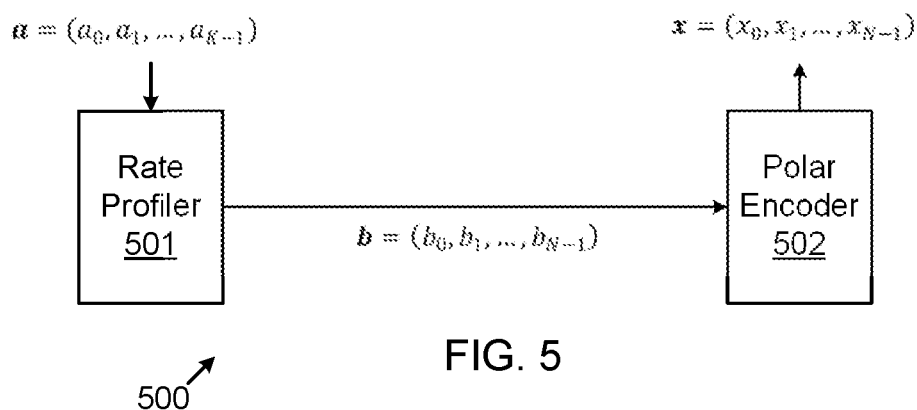
FIG. 5 illustrates an example of polar codeword generation.

FIG. 5 illustrates an example of polar codeword generation. Referring to FIG. 5, $a=(a_0, a_1, \ldots, a_{K-1})$, $u=(u_0, u_1, \ldots, u_{N-1})$, and $x=(x_0, x_1, \ldots, x_{N-1})$ are binary row vectors with length K, N, and N, respectively, where $N=2^n$, n is a natural number, and K<N. a represents message bits (concatenated with or without cyclic redundancy check (CRC) bits). As shown in FIG. 5, a message a is mapped into a codeword x through the rate profiler 501 and a polar encoder 503, which form the polar codeword generation system 500.

The input of the rate profiler 501 is a and the output of the rate profiler 501 is u. The notations used to help describe operation of the rate profiler 501 are defined in TABLE 1 below:

TABLE 1

| Symbol | Definition |
| --- | --- |
| Z(i) | Reliability of the virtual sub-channel corresponding to index i, where $0 \leq i \leq N - 1$. The approaches for calculating Z(i) maybe, but are not limited to, density evolution, Bhattacharyya parameter, and Reed-Muller rule. |
| Q | Information set. Defined as a set containing K most reliable indices, i.e., $Q \triangleq \{i_{(N-K)}, \ldots, i_{(N-1)}\}$, where $(i_{(0)}, i_{(1)}, \ldots, i_{(N-1)})$ is the ordered version of sequence $(0, 1, \ldots, N - 1)$ in ascending order of reliability, i.e., $Z(i_{(0)}) < Z(i_{(1)}) < \ldots < Z(i_{(N-1)})$. For convenience, denote $Q_0, Q_1, \ldots, Q_{K-1}$ as the elements of Q and $Q_0 < Q_1 < \ldots < Q_{K-1}$. |
| $\mathcal{F}$ | Frozen set. Defined as the complement of Q with respect to $(0,1, \ldots, N - 1)$, i.e., $\mathcal{F} \triangleq \{0, 1, \ldots, N - 1\} \backslash Q$. |
| $u_Q$ | A subset of u that contains the elements whose indices belong to a set Q, i.e., $u_Q \triangleq (u_{Q_0}, u_{Q_1}, \ldots, u_{Q_{K-1}})$. |
| bin(i) | Binary form of index i, where $0 \leq i \leq N - 1$. $bin(i) \triangleq i_{n-1} \ldots i_1 i_0$, where $i_{n-1}$ is the most significant bit and $i_0$ is the least significant bit. Thus, $i = \Sigma_{a=0}^{n-1} i_a \times 2^a$. For example, bin(6) = 110. |

TABLE 1-continued

| Symbol | Definition |
|---|---|
| $S_i$ | Support of index i, where $0 \leq i \leq N - 1$. Defined as the set of indices at which bin(i) has non-zero values, i.e., $S_i \triangleq \{\in (0, 1, \cdots, n - 1): i_a = 1\}$. For example, bin(6) = 110 has non-zero values at position 1 and 2, and therefore, the support of index 6 is $S_6 = \{1, 2\}$. |
| $|\cdot|$ | The number of elements of a set. For example, $|S_6| = 2$. |
| $g_i$ | $i^{th}$ row of the generator matrix $G_N$, where $0 \leq i \leq N - 1$. |
| $w(g_i)$ | The weight of $g_i$. Defined as the number of non-zero elements of $g_i$. |

Based on the information set Q and the frozen set $\mathcal{F}$, u is obtained by placing zeros at indices belonging to frozen set, i.e., $\{u_i=0: i \in \mathcal{F}\}$, as well as the message bits a at indices belonging to the information set. Note that the 1:1 relationship between a and $u_Q$ is not restricted, and in the disclosure, it is assumed that ith message bit is mapped to ith element of $u_Q$, i.e., $u_{Qi}=a_i$.

The input of the rate profiler 501 is a and the output of the rate profiler 501 is u. Channel polarization leads to virtual sub-channels with different reliabilities, where the reliabilities of the virtual sub-channels can be calculated by (but not necessarily limited to) one of density evolution, the Bhattacharyya parameter, and the Reed-Muller rule. The K message bits are assigned at the indices corresponding to the K most reliable virtual sub-channels. Zeros are assigned at the remaining indices. Accordingly, the rate profiler 501 assigns message bits and zeros via $u_Q=a$ and $\{u_i=0, i \in \mathcal{F}\}$. $Q \subseteq (0, 1, \ldots, N-1)$ denotes the information set, $\mathcal{F} \triangleq \{0, 1, \ldots, N-1\} \backslash Q$ is the frozen set. Based on the information set Q and the frozen set $\mathcal{F}$, u is obtained by placing zero bits at indices belonging to frozen set, i.e., $u_i=0$, $i \in F$, as well as mapping message bits a to the (most reliable) information indices $u_Q$. Note that the 1:1 relationship between a and $u_Q$ is not restricted, and in this disclosure, it is assumed that the $i^{th}$ message bit is mapped to the $i^{th}$ element of $u_Q$, i.e., $u_{Qi}=a_i$, where $i=0, 1, \ldots, K-1$.

Figure 6:
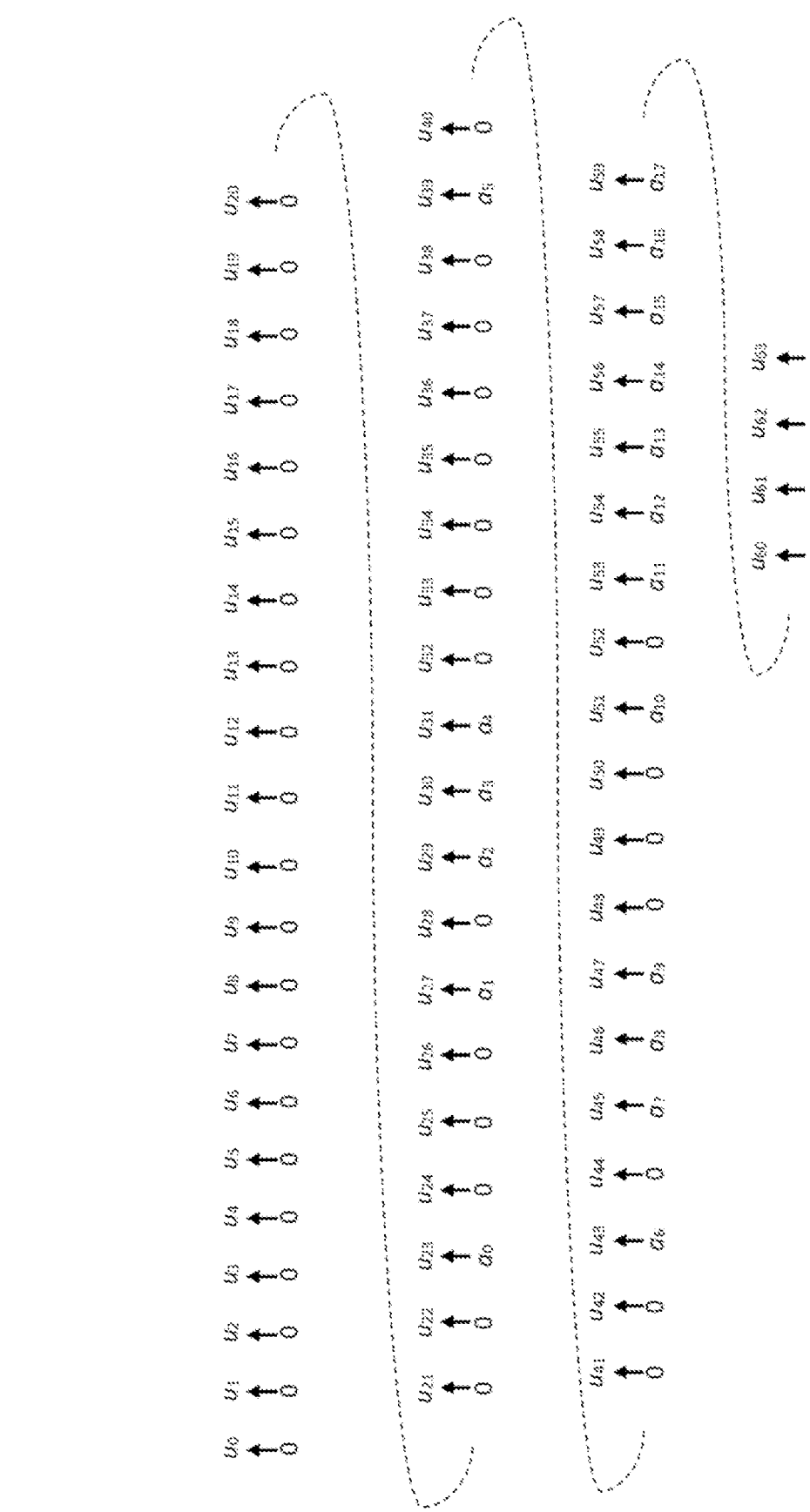
FIG. 6 illustrates an example of rate profiling.

FIG. 6 illustrates an example of rate profiling, performed by rate profiler 501. In the example shown, N=64, K=22, and the ordered indices according to reliability in ascending order are [0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 58, 60, 31, 47, 55, 59, 61, 62, 63]. The K most reliable indices, marked in boldface in the foregoing list, are used for the information set Q and the remaining indices are the frozen set $\mathcal{F}$:

Q=(23, 27, 29, 30, 31, 39, 43, 45, 46, 47, 51, 53, 54, 55, 56, 57, 58, 59, 60, 61, 62, 63), and $\mathcal{F}$ =(0, 1, 2, 3, 4, 5, 6, 7, 8, 9, 10, 11, 12, 13, 14, 15, 16, 17, 18, 19, 20, 21, 22, 24, 25, 26, 28, 32, 33, 34, 35, 36, 37, 38, 40, 41, 42, 44, 48, 49, 50, 52).

As shown in FIG. 6, the message bits $[a_0, a_1, \ldots, a_{21}]$ and zeros are mapped to $[u_0, u_1, \ldots, u_{N-1}]$ in the following manner, for the example shown:

$$u_{23} = a_0, u_{27} = a_1, \cdots, u_{63} = a_{21}$$

and $$u_0 = u_1 = \cdots = u_{52} = 0.$$

The input of the polar encoder 502 is u and the output of the polar encoder 502 is x. The polar encoder 502 maps u to x through the generator (square) matrix $$G_N = \begin{bmatrix} 1 & 0 \\ 1 & 1 \end{bmatrix}^{\otimes n},$$

i.e., $x=u \times G_N$, where $\otimes$ is the Kronecker product.

Figure 7:
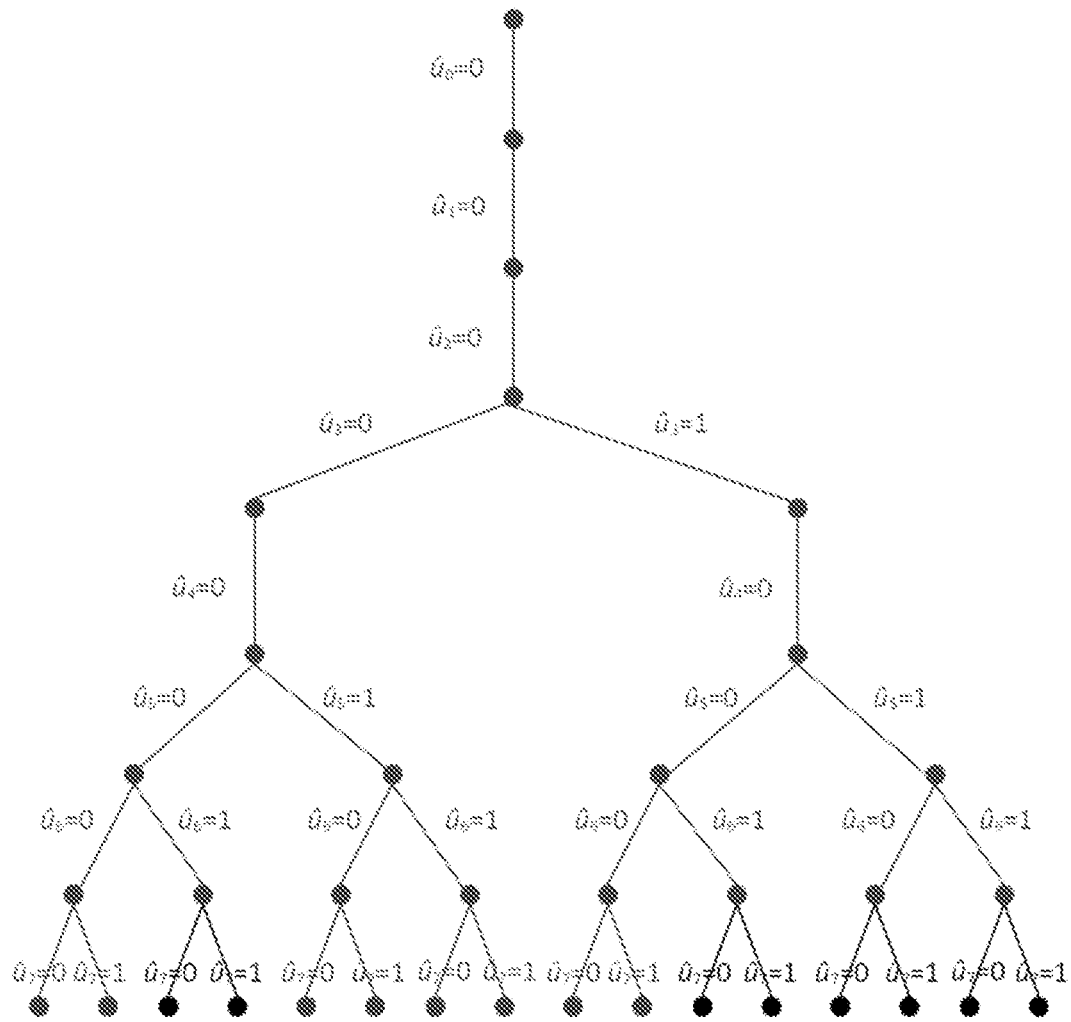
FIG. 7 illustrates paths for successive cancellation list (SCL) decoding of polar codes.

FIG. 7 illustrates paths for successive cancellation list (SCL) decoding of polar codes. Polar codes may be decoded using an SCL decoder. Denote $\hat{u}_i$ as the decoded version of $u_i$. In a SCL decoder, $[\hat{u}_0, \hat{u}_1, \ldots, \hat{y}_{N-1}]$ are decoded sequentially. After decoding $\hat{u}_i$, multiple realizations of $[\hat{u}_0, \hat{u}_1, \ldots, \hat{u}_{N-1}]$ are obtained and stored in a list, where each realization is referred to as a path. For the SCL decoder with list size L, after decoding $\hat{u}_i$, when the number of paths is larger than the list size, the L most likely possible paths are kept, and the other paths are discarded. After decoding $\hat{u}_{N-1}$, the SCL decoder will generates L paths, each of which corresponds to a candidate codeword. In the case of conventional polar codes (without CRC, as described herein), the SCL decoder selects the codeword with the highest likelihood from the list as the decoded codeword. In the example of FIG. 7, N=8 and K=8, and indices (3,5,6,7) are used for message bits while indices (1,24,6) contain zeros. Each path in FIG. 7 represents a possible codeword and the 8 most likely possible paths are included in the list and the decoding process continues. Starting with the fourth message bit ($u_7=1$), the correct path (the rightmost path at each branch) is determined and decoding may be discontinued.

Figure 8:
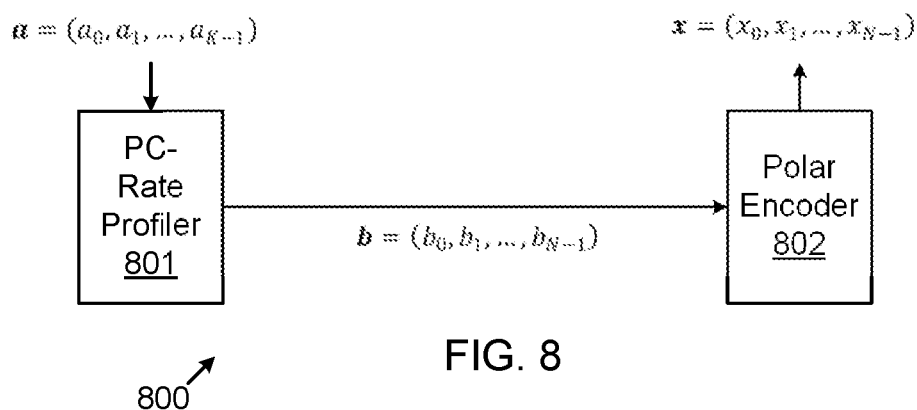
FIG. 8 illustrates an example of polar code generation with parity check bits in accordance with embodiments of the present disclosure.

FIG. 8 illustrates an example of polar code generation with parity check bits in accordance with embodiments of the present disclosure. The embodiment of the polar code generation system 800 shown in FIG. 8 is for illustration only. Other embodiments of the polar code generation system 800 could be used without departing from the scope of this disclosure.

FIG. 8 depicts a rate profiler with parity check (PC) bits, referred to as PC-rate profiler 801, as well as a polar encoder 802. The polar code generation system 800 implemented by concatenating a PC-rate profiler 801 and a polar encoder 802 is referred to as PC-polar encoder. Referring to FIG. 8, $a=(a_0, a_1, \ldots, a_{k-1})$, $u=(u_0, u_1, \ldots, u_{N-1})$, and $x=(x_0, x_1, \ldots, x_{N-1})$ are binary row vectors with length K, N, and N, respectively, where $N=2^n$, n is a natural number, and $K<N$. a represents message bits (concatenated with or without cyclic redundancy check (CRC) bits). The symbols used to help the description of the PC-polar encoder 801 are defined in TABLE 1 above and TABLE 2 below:

TABLE 2

| Symbol | Definition |
|---|---|
| $\tilde{Q}$ | PC-information set. Defined as a set containing $K + n_{pc}$ most reliable indices, i.e., $\tilde{Q} \triangleq \{i_{(N-K-n_{PC})}, \cdots, i_{(N-1)}\}$, where $n_{PC}$ denotes the number of PC bits and $K + n_{PC} < N$. For convenience, denote $\tilde{Q}_0, \tilde{Q}_1, \cdots, \tilde{Q}_{K+n_{PC}-1}$ as the elements of $\tilde{Q}$ and $\tilde{Q}_0 < \tilde{Q}_1 < \cdots < \tilde{Q}_{K+n_{PC}-1}$. |
| $\mathcal{A}$ | Defined as a subset of $\tilde{Q}$ with size $n_{PC}$. The $n_{PC}$ PC bits are placed at indices belonging to $\mathcal{A}$. |
| $\mathcal{B}$ | Defined as a subset of $\tilde{Q}$ with size m, where $0 \leq m \leq K$, and $\mathcal{A}$ and $\mathcal{B}$ are disjoint. |

TABLE 2-continued

| Symbol | Definition |
|---|---|
| | The PC bits are generated according to the message bits placed at indices belonging to $\mathcal{B}$. |

The input of the PC-rate profiler 801 is a and the output of the PC-rate profiler 801 is u. Based on the PC-information set $\tilde{Q}$, the PC-rate profiler 801 places zeros at indices not belonging to the PC-information set, i.e., $\{u_i=0: i \in (0, \ldots, N-1)\backslash\tilde{Q}\}$. Based on the PC-information set $\tilde{Q}$ and the set $\mathcal{A}$, the PC-rate profiler 801 places the message bits a at indices which belong to the PC-information set but do not belong to the set $\mathcal{A}$, i.e., $u_{\tilde{Q}\backslash\mathcal{A}}$=a. Then, the m message bits located at the m indices belonging to the set $\mathcal{B}$ are combined to generate $n_{PC}$ PC bits. The generated $n_{PC}$ PC bits are placed at the $n_{PC}$ indices belonging to the set $\mathcal{A}$. Construction of the sets $\mathcal{A}$ and $\mathcal{B}$ is described below.

The input of the polar encoder 802 is u and the output of the polar encoder 802 is x. The polar encoder 802 maps u to x through the generator matrix $$G_N = \begin{bmatrix} 1 & 0 \\ 1 & 1 \end{bmatrix}^{\otimes n},$$

i.e., $x = u \times G_N$, where $\otimes$ is the Kronecker product.

During the SCL decoding with list size L in the case of polar codes with CRC, the SCL decoder first removes the codewords failing to pass the CRC check from the list, and then selects the codeword with the highest likelihood from the remainder of the list as the decoded codeword. After decoding the first $[\log_2(L)]$ message bits, the path corresponding to the correct codeword must be included in the list. In other words, when decoding the subsequent message bits, more than L paths are generated and the path corresponding to the correct codeword might possibly be removed from the list. To reduce the probability of the correct path being removed from the list, the first $[\log_2(L)]$ message bits need more protection. In an embodiment of the disclosure, the first numerically-ordered $[\log_2(L)]$ message bits can be used to generate PC bits. The PC bits can be placed at indices coming (in numerical order) after the indices for the $[\log_2(L)]$ message bits, such that the error events due to the incorrect decoding of the first $[\log_2(L)]$ message bits can be corrected immediately during SCL decoding.

Figure 9:
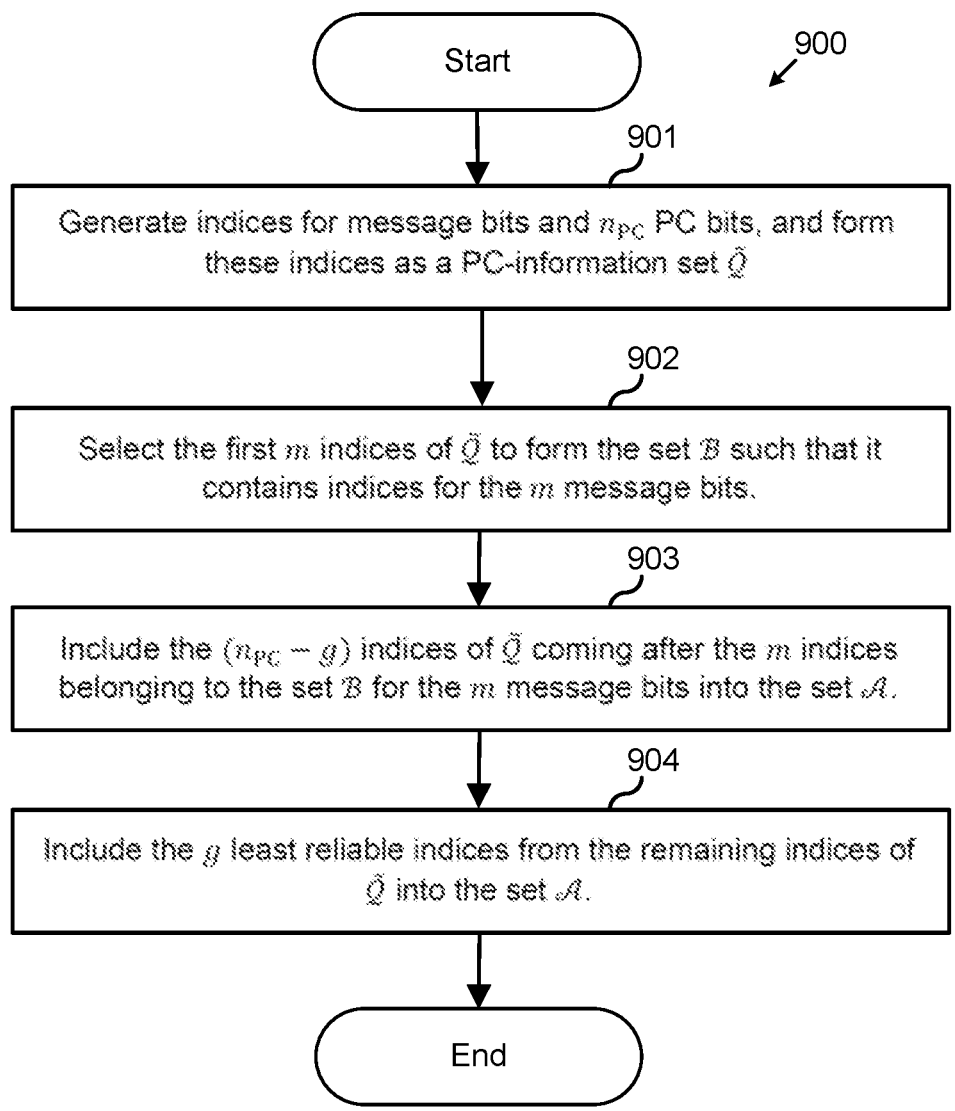
FIG. 9 is a high level flowchart of a process of constructing the sets of indices for generating and assigning parity check bits in accordance with embodiments of the present disclosure.

FIG. 9 is a high level flowchart of a process of constructing the sets of indices for generating and assigning parity check bits in accordance with embodiments of the present disclosure. The process 900 illustrated in FIG. 9 is for illustration only, and FIG. 9 does not limit the scope of this disclosure to any particular implementation. The process 900 may be performed by either the controller/processor 225 in FIG. 2 or the processor 340 of FIG. 3.

FIG. 9 is an example flowchart for the construction of the set $\mathcal{A}$ and the set $\mathcal{B}$, whose definitions are shown in TABLE 2, in an embodiment of the disclosure. Referring to FIG. 9, at operation 901, the PC-information set $\tilde{Q}$ for K message bits and $n_{PC}$ PC bits are generated.

In one embodiment of the disclosure, at operation 901, machine learning can be employed to construct the set $\tilde{Q}$ by training the probability of each index being frozen.

$\mathcal{B}$ is a set consisting of indices for message bits which are used to generate parity check bits. $\mathcal{A}$ is a set consisting of indices for the generated parity check bits. At operation 902, the first m indices of the PC-information set $\tilde{Q}$ are selected to form the set $\mathcal{B}$, i.e., $\mathcal{B} = (\tilde{Q}_0, \tilde{Q}_1, \ldots, \tilde{Q}_{m-1})$.

At operation 903, the $n_{PC}-g$ indices coming after the index $\tilde{Q}_{m-1}$, i.e., $(\tilde{Q}_m, \ldots, \tilde{Q}_{m+n_{PC}-g-1})$, are included into the set $\mathcal{A}$, where $0 \le g \le n_{PC}$.

At operation 904, the g least reliable indices of the remaining indices $\{j : j \in Q^\sim (Q^\sim\_0, Q^\sim\_1, \ldots, Q^\sim\_(m+n\_PC-g-1))\}$ are included into the set $\mathcal{A}$. The reliability is defined as in TABLE 1. This operation avoids the case that information indices with high reliability are occupied by the PC bits. By adjusting g, the number of PC bits placed at relatively low-reliability indices can be controlled.

In one embodiment of the invention, at operations 902 through 904, machine learning can be used to select more vulnerable message bits to be combined to generate parity check bits, as well as to determine the indices for placement of the generated parity check bits.

Although FIG. 9 illustrates one example process 900 for constructing the sets of indices for generating and assigning parity check bits, various changes may be made to FIG. 9. For example, while shown as a series of steps, various steps in FIG. 9 may overlap, occur in parallel, or occur any number of times.

Figure 10:
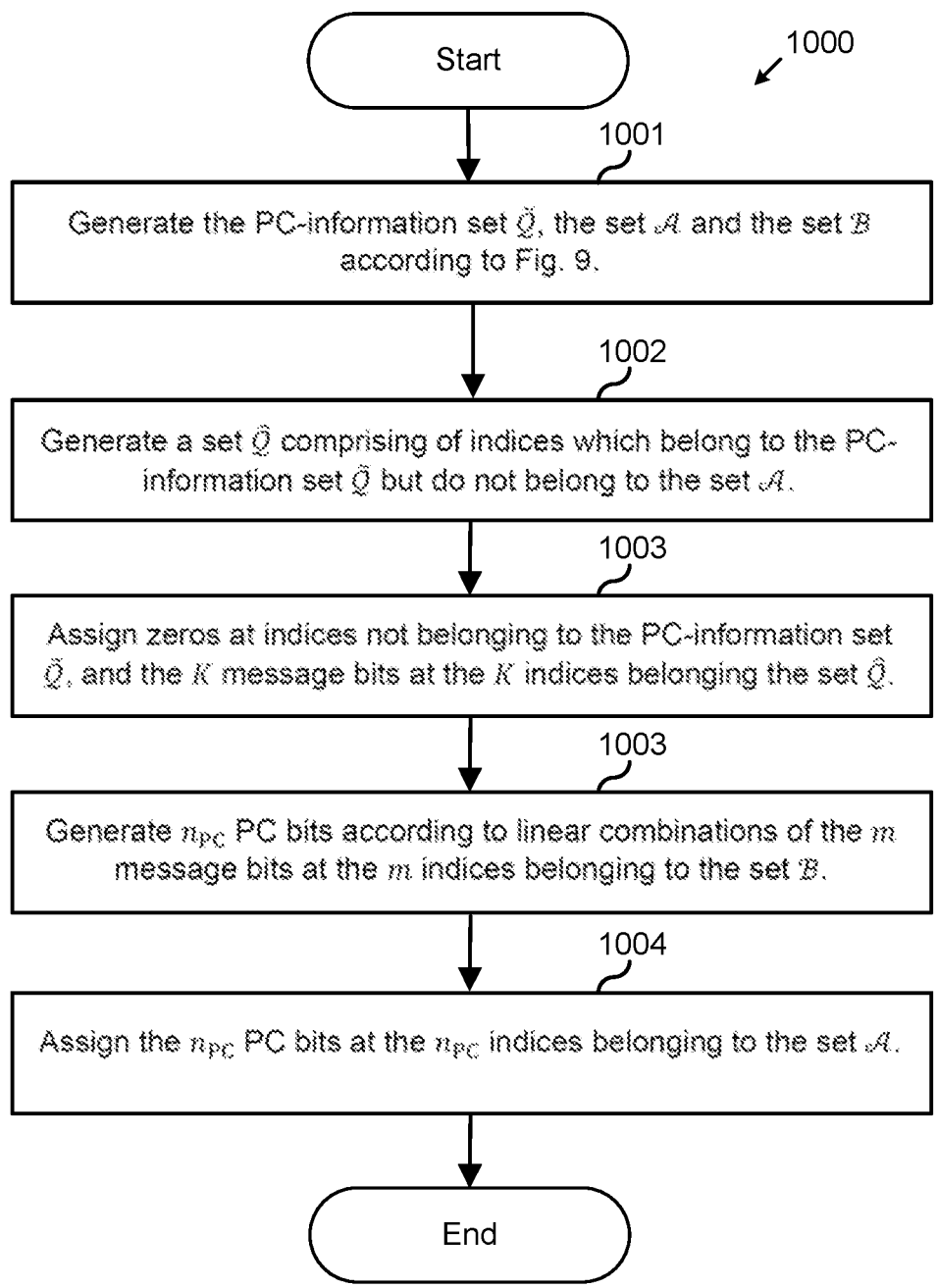
FIG. 10 is a high level flowchart of a process of rate profiling with parity check bits in accordance with embodiments of the present disclosure.

FIG. 10 is a high level flowchart of a process of rate profiling with parity check bits in accordance with embodiments of the present disclosure. The process 1000 illustrated in FIG. 10 is for illustration only, and FIG. 10 does not limit the scope of this disclosure to any particular implementation. The process 1000 may be performed by either the controller/processor 225 in FIG. 2 or the processor 340 of FIG. 3.

FIG. 10 is an example flowchart illustrating PC-rate profiling in an embodiment of the disclosure. Referring to FIG. 10, at operation 1001, the set $\mathcal{A}$ and the set $\mathcal{B}$ are generated according to FIG. 9, where the parity check bits are generated according to the message bits placed at indices belonging to $\mathcal{B}$, and the generated parity check bits are placed at indices belonging to $\mathcal{A}$.

At operation 1002, a set containing indices which belong to the PC-information set $\tilde{Q}$ but do not belonging to the set $\mathcal{A}$ is generated and denoted as $\hat{Q} \triangleq \tilde{Q} \backslash \mathcal{A}$.

At operation 1003, zeros and K message bits are assigned at indices belonging to the set $(0, \ldots, N-1) \backslash \hat{Q}$ and the set $\hat{Q}$, respectively.

At operation 1004, based on the m message bits at the m indices belonging to the set $\mathcal{B}$, $n_{PC}$ PC bits are generated by any linear combinations of the m message bits. For example, the linear combination applied in FIG. 11 is repetition.

At operation 1005, the generated $n_{PC}$ PC bits are assigned at indices belonging to the set $\mathcal{A}$.

Although FIG. 10 illustrates one example process for rate profiling with parity check bits, various changes may be made to FIG. 10. For example, while shown as a series of steps, various steps in FIG. 10 may overlap, occur in parallel, or occur any number of times.

Figure 11:
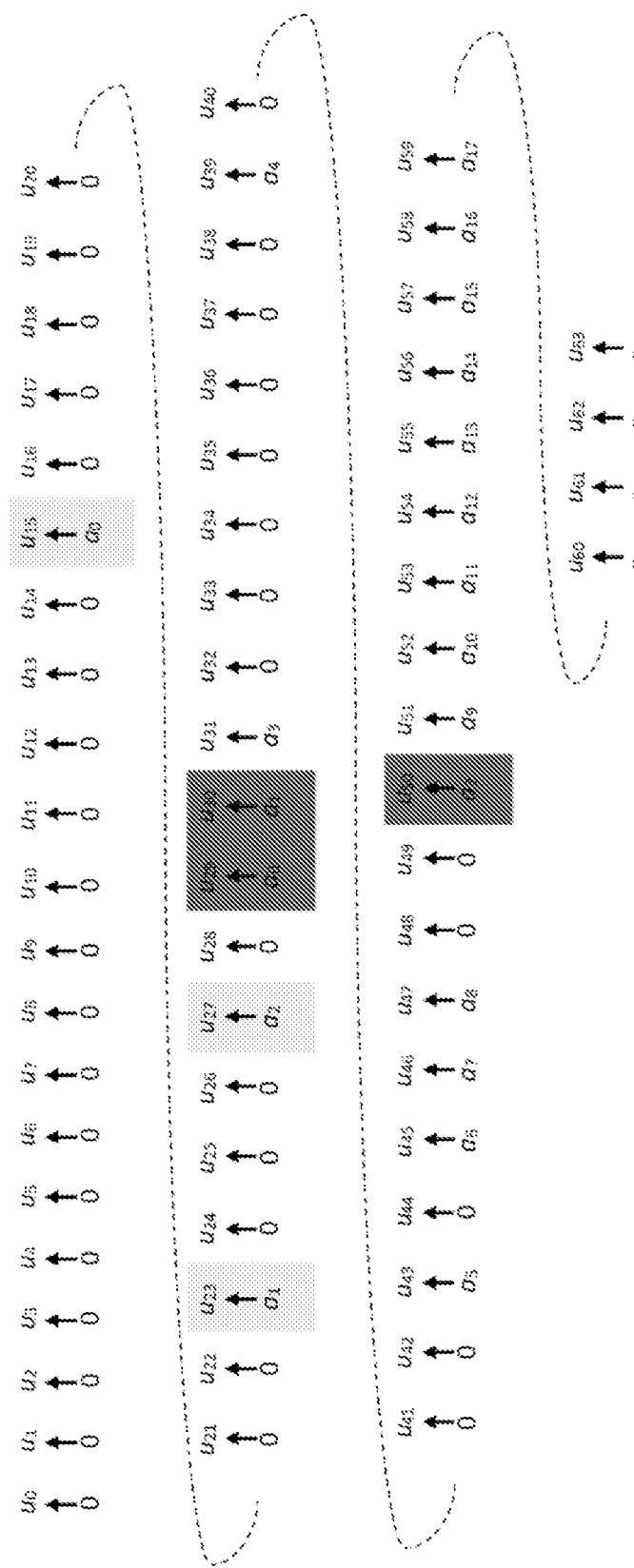
FIG. 11 illustrates an example of rate profiling, performed by PC-rate profiler 801, in accordance with embodiments of the present disclosure.

FIG. 11 illustrates an example of rate profiling, performed by PC-rate profiler 801, in accordance with embodiments of the present disclosure. The example illustrated in FIG. 11 is for illustration only, and FIG. 11 does not limit the scope of this disclosure to any particular implementation.

FIG. 11 illustrates an example operation for the PC-rate profiling in an embodiment of the disclosure. In this example, N=64, K=22, m=3, $n_{PC}$=3, g=1, and Q=(15,23,27, 29,30,31,39,43,45,46,47,50,51,52,53,54,55,56,57,58,59,60, 61,62,63). That is, the indices ordered according to reliability in ascending order are: (0,1,2,4,8,16,32,3,5,9,6,17,10,18, 12,33,20,34,24,36,7,11,40,19,13,48,14,21,35,26,37,25,22, 38,41,28,42,49,44,50,15,52,23,56,27, 39,29,43,30,45,51,46, 53,54,57,58,60,31,47,55,59,61,62,63). The most-reliable K+$n_{PC}$ indices are (50,15,52,23,56,27,39,29,43,30,45,51,46, 53,54,57,58,60,31,47,55,59,61,62,63). In ascending numerical order, the most-reliable K+$n_{PC}$ indices are (15,23,27,29, 30,31,39,43, 45,46,47,50,51,52,53,54,55,56,57,58,59,60,61, 62,63). Zeros are assigned to the least-reliable indices, i.e., (0,1,2,4,8,16,32,3,5,9,6,17,10,18,12,33,20,34,24,36,7,11, 40,19,13,48,14,21,35, 26,37,25,22,38,41,28,42,49,44) or, in ascending numerical order, (0,1,2,3,4,5,6,7,8,9,10,11, 12,13, 14,16,17,18,19,20,21,22,24,25,26,28,32,33,34,35,36,37,38, 40,41,42,44,48,49).

According to the process of FIG. 9, the set $\mathcal{B}$ is made of the first 3 indices of $\tilde{Q}$ in ascending numerical order, i.e., $\mathcal{B}$ =(15,23,27). The set $\mathcal{A}$ contains 4th and 5th index of $\tilde{Q}$ in ascending numerical order, i.e., {29, 30}, and the least reliable one of the remaining indices, i.e., 50, and therefore $\mathcal{A}$ =(29,30,50). The reliability order in this example may depend, for example, on the 5G NR standards. As shown in FIG. 11, at indices belonging to (0,1, ..., N−1)\$\tilde{Q}$, zeros are assigned, i.e., {u_i=0: i∈(0,1, ..., N−1)\$Q\tilde{\ }$=(0,1,2,3,4,5,6,7,8,9,10,11,12,13,14,16,17,18,19, 20,21,22,24,25,26,28,32,33,34,35,36,37,38,40,−+41,42,44, 48,49)}.

Based on the set $\tilde{Q}$ and the set $\mathcal{A}$, the message bits ($a_0$, $a_1$, ..., $a_{21}$) are placed at indices i∈$\tilde{Q}$\$\mathcal{A}$ =(15,23,27,31, 39,43,45,46,47,51,52,53,54,55,56,57,58,59,60,61,62,63) in the example of FIG. 11 as follows:

$$u_{15} = a_0, u_{23} = a_1, u_{27} = a_2, u_{31} = a_3, ..., u_{63} = a_{21}.$$

Then, based on the set $\mathcal{A}$ and $\mathcal{B}$, the 3 message bits placed at indices belonging to the set $\mathcal{B}$ =(15,23,27) (which are highlighted in light gray in FIG. 11) are repeated at indices belonging to the set $\mathcal{A}$ =(29,30,50) (which are highlighted in dark gray in FIG. 11) in the following manner:

$$u_{29} = u_{15}, u_{30} = u_{23}, u_{50} = u_{27}.$$

Note that the 1:1 relationship between $u_\mathcal{B}$ and $u_\mathcal{A}$ is not restricted, and in this embodiment of the disclosure, it is assumed that the ith element of $u_\mathcal{B}$ is mapped to ith element of $u_\mathcal{A}$.

Figure 12A:
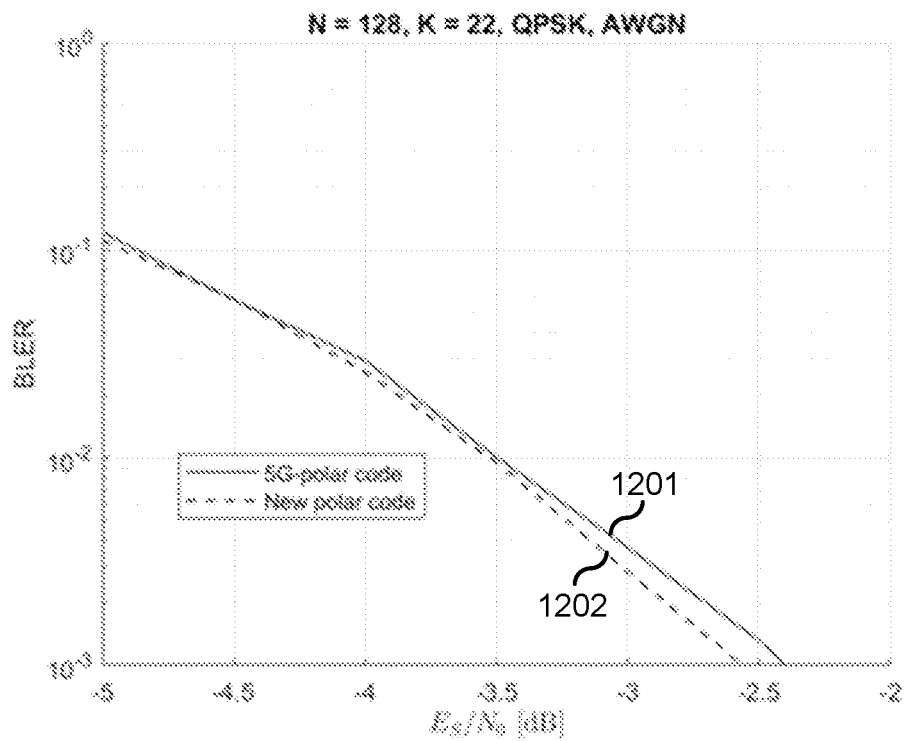
FIGS. 12A, 12B, and 12C compare the block error rate, as a function of the ratio of transmitted symbol energy to average noise energy, for polar codes with and without the encoding method according to embodiments of the present disclosure.
Figure 12B:
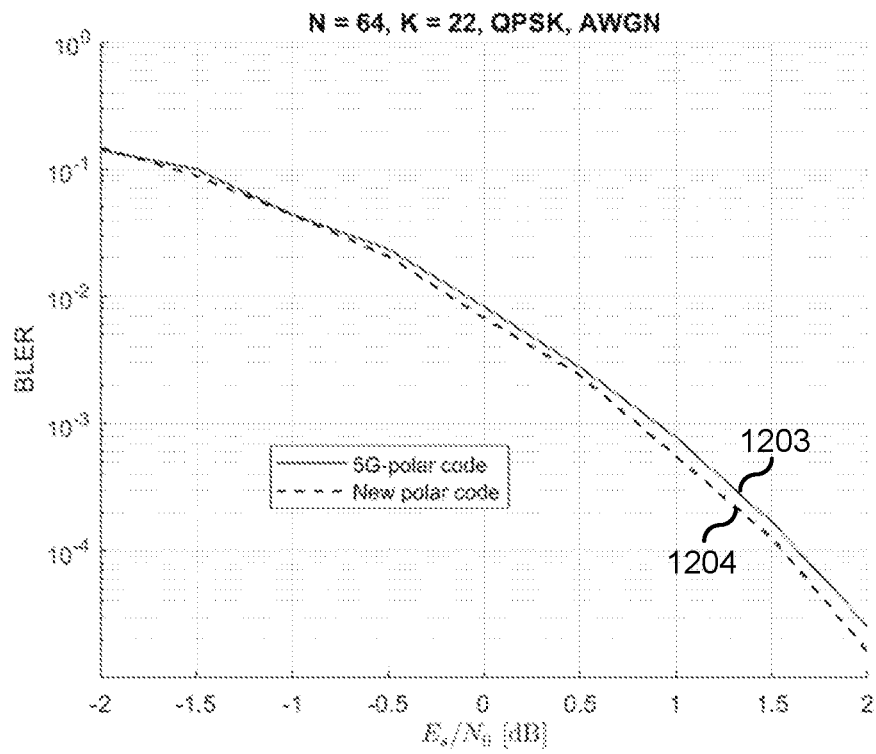
Figure 12C:
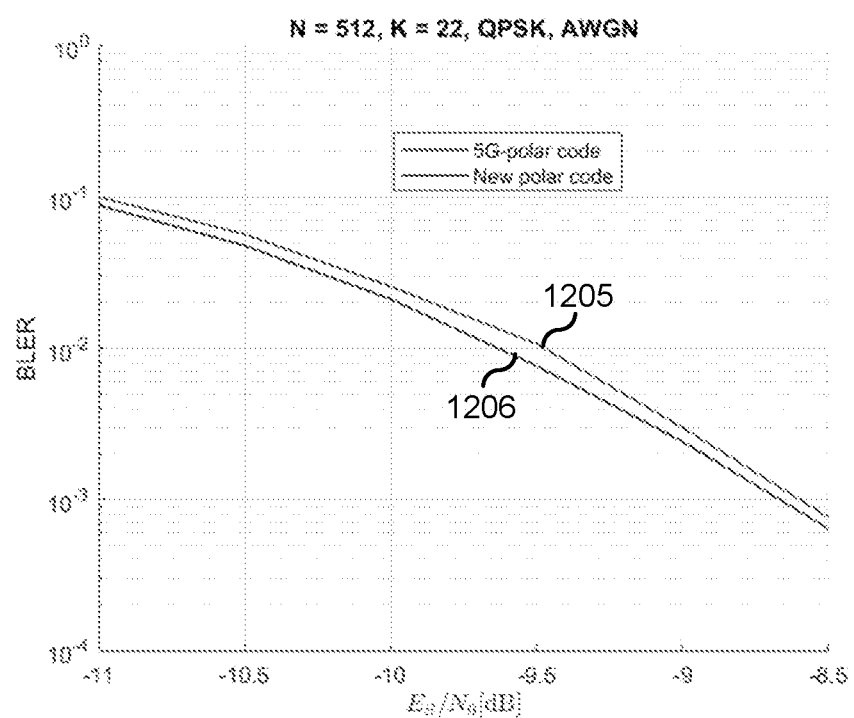

FIGS. 12A, 12B, and 12C compare the block error rate, as a function of the ratio of transmitted symbol energy $E_S$ to average noise energy $N_0$ (in decibels (dB)), for polar codes with and without the encoding method according to embodiments of the present disclosure. FIGS. 12A, 12B, and 12C compare the error-correcting performance of polar codes without and with PC-rate profiling according to an embodiment of the disclosure. Assumptions of QPSK modulation, an additive white Gaussian noise (AWGN) channel, and m=$n_{PC}$=3 underlie each of FIGS. 12A, 12B, and 12C, and 6-bit cyclic redundancy check (CRC) and successive cancellation list (SCL) decoding with list size 8 are applied in each. The reliability order in all plots depends on the 5G NR standards. In FIG. 12A, N=128, K=22, g=1, and a PC bit is generated by repeating a message bit. Curve 1201 indicates performance of polar codes without PC-rate profiling, while curve 1202 indicates performance of polar codes with PC-rate profiling. In FIG. 12B, N=64, K=22, g=1, and the 3 PC bits are equal to the summation of the 3 message bits. Curve 1203 indicates performance of polar codes without PC-rate profiling, while curve 1204 indicates performance of polar codes with PC-rate profiling. In FIG. 12C, N=512, K=22, g=0, and a PC bit is generated by repeating a message bit. Curve 1205 indicates performance of polar codes without PC-rate profiling, while curve 1206 indicates performance of polar codes with PC-rate profiling. As shown in FIGS. 12A, 12B, and 12C, the polar codes with PC-rate profiling continuously outperform polar codes without PC-rate profiling by up to 0.2 dB.

Although the present disclosure has been described with exemplary embodiments, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. A method for encoding, the method comprising:
receiving a plurality of information bits to be transmitted in a plurality of message indices;
assigning zeros to message indices not among a reliable set of the message indices;
assigning the plurality of information bits to message indices among the reliable set of the message indices;
identifying a set of the information bits to be used in generating parity check bits to improve error-correcting performance;
generating the parity check bits based on the identified set of the information bits;
assigning the parity check bits to selected message indices among the reliable set of the message indices;
generating a plurality of polar encoded bits by performing a polar encoding operation on bits assigned to the message indices; and
providing the plurality of polar encoded bits for transmission or storage.

2. The method of claim 1, wherein assigning the plurality of information bits to message indices among a reliable set of the message indices further comprises:
selecting a number K+$n_{PC}$ of the reliable set of the message indices, where K is a message length and $n_{PC}$ is a number of the parity check bits;
assigning the plurality of information bits to a subset of the K+$n_{PC}$ reliable message indices.

3. The method of claim 2, wherein the identified set of the information bits on which the parity check bits are generated comprise bits from a first numerically-ordered $n_{PC}$ indices to which information bits are assigned.

4. The method of claim 3, wherein the selected message indices to which the parity check bits are assigned include message indices immediately following, in numerical order, the first numerically-ordered $n_{PC}$ indices.

5. The method of claim 1, wherein assigning the plurality of information bits to message indices among the reliable set of the message indices comprises assigning information bits to a first numerically-ordered $n_{PC}$ indices among the reliable set of the message indices.

6. The method of claim 5, wherein assigning the parity check bits to selected message indices among the reliable set of the message indices comprises assigning parity check bits to message indices immediately following the first numerically-ordered $n_{PC}$ indices.

7. The method of claim 6, wherein assigning the parity check bits to selected message indices among the reliable set of the message indices further comprises assigning parity check bits to a number g of low-reliability message indices among the reliable set of the message indices to which neither an information bit nor a parity check bit have already been assigned.

8. The method of claim 7, wherein assigning the plurality of information bits to message indices among the reliable set of the message indices further comprises, after assigning information bits to the first numerically-ordered $n_{PC}$ indices and assigning the parity check bits to the selected message indices, assigning remaining information bits to remaining message indices among the reliable set of the message indices.

9. An encoding apparatus, comprising:
a transceiver; and
a processor configured to:
receive a plurality of information bits to be transmitted in a plurality of message indices,
assign zeros to message indices not among a reliable set of the message indices,
assign the plurality of information bits to message indices among the reliable set of the message indices,
identify a set of the information bits to be used in generating parity check bits to improve error-correcting performance,
generate the parity check bits based on the identified set of the information bits,
assign the parity check bits to selected message indices among the reliable set of the message indices,
generate a plurality of polar encoded bits by performing a polar encoding operation on bits assigned to the message indices, and
provide the plurality of polar encoded bits for transmission or storage.

10. The encoding apparatus of claim 9, wherein, to assign the plurality of information bits to message indices among a reliable set of the message indices, the processor is further configured to:
select a number $K+n_{PC}$ of the reliable set of the message indices, where K is a message length and $n_{PC}$ is a number of parity check bits; and
assign the plurality of information bits to a subset of the $K+n_{PC}$ reliable message indices.

11. The encoding apparatus of claim 10, wherein the identified set of the information bits on which the parity check bits are generated comprise bits from a first numerically-ordered $n_{PC}$ indices to which information bits are assigned.

12. The encoding apparatus of claim 11, wherein the selected message indices to which the parity check bits are assigned include message indices immediately following, in numerical order, the first numerically-ordered $n_{PC}$ indices.

13. The encoding apparatus of claim 9, wherein assigning the plurality of information bits to message indices among the reliable set of the message indices comprises assigning information bits to a first numerically-ordered $n_{PC}$ indices among the reliable set of the message indices.

14. The encoding apparatus of claim 13, wherein assigning the parity check bits to selected message indices among the reliable set of the message indices comprises assigning parity check bits to message indices immediately following the first numerically-ordered $n_{PC}$ indices.

15. The encoding apparatus of claim 14, wherein assigning the parity check bits to selected message indices among the reliable set of the message indices further comprises assigning parity check bits to a number g of low-reliability message indices among the reliable set of the message indices to which neither an information bit nor a parity check bit have already been assigned.

16. The encoding apparatus of claim 15, wherein assigning the plurality of information bits to message indices among the reliable set of the message indices further comprises, after assigning information bits to the first numerically-ordered $n_{PC}$ indices and assigning the parity check bits to the selected message indices, assigning remaining information bits to remaining message indices among the reliable set of the message indices.

17. A decoding apparatus for use in a communication channel, the decoding apparatus comprising:
a transceiver configured to receive a polar code with parity check bits from the communication channel; and
a processor configured to perform successive cancellation list decoding of the polar code with parity check bits, wherein the polar code with parity check bits is generated by:
receiving a plurality of information bits to be transmitted in a plurality of message indices,
assigning zeros to message indices not among a reliable set of the message indices,
assigning the plurality of information bits to message indices among the reliable set of the message indices,
identifying a set of the information bits to be used in generating parity check bits to improve error-correcting performance,
generating the parity check bits based on the identified set of the information bits,
assigning the parity check bits to selected message indices among the reliable set of the message indices,
generating a plurality of polar encoded bits by performing a polar encoding operation on bits assigned to the message indices, and
providing the plurality of polar encoded bits for transmission or storage.

18. The decoding apparatus of claim 17, wherein the identified set of the information bits on which the parity check bits are generated comprise bits from a first numerically-ordered $n_{PC}$ indices to which information bits are assigned.

19. The decoding apparatus of claim 18, wherein the selected message indices to which the parity check bits are assigned include message indices immediately following, in numerical order, the first numerically-ordered $n_{PC}$ indices, where $n_{PC}$ is a number of the parity check bits.

20. The decoding apparatus of claim 19, wherein assigning the plurality of information bits to message indices among the reliable set of the message indices comprises assigning information bits to a first numerically-ordered $n_{PC}$ indices among the reliable set of the message indices.

* * * * *